United States Patent
Kang

(10) Patent No.: US 9,065,046 B2
(45) Date of Patent: Jun. 23, 2015

(54) SEMICONDUCTOR DEVICE AND METHOD FOR FABRICATING THE SAME, AND MICROPROCESSOR, PROCESSOR, SYSTEM, DATA STORAGE SYSTEM AND MEMORY SYSTEM INCLUDING THE SEMICONDUCTOR DEVICE

(71) Applicant: SK HYNIX INC., Icheon (KR)

(72) Inventor: Hee-Sung Kang, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/042,590

(22) Filed: Sep. 30, 2013

(65) Prior Publication Data
US 2014/0339488 A1    Nov. 20, 2014

(30) Foreign Application Priority Data

May 20, 2013  (KR) .................. 10-2013-0056397

(51) Int. Cl.
*H01L 29/02* (2006.01)
*H01L 45/00* (2006.01)
*H01L 27/24* (2006.01)

(52) U.S. Cl.
CPC .............. *H01L 45/146* (2013.01); *H01L 45/08* (2013.01); *H01L 45/1233* (2013.01); *H01L 45/165* (2013.01); *H01L 27/2463* (2013.01)

(58) Field of Classification Search
CPC . H01L 45/1233; H01L 45/16; H01L 45/1608; H01L 45/04; H01L 45/06; H01L 45/141; H01L 45/146
USPC .............. 257/1–5, E21.004, E29.308; 438/82, 438/95, 382, 102, 104
See application file for complete search history.

(56) References Cited

U.S. PATENT DOCUMENTS

| | | | |
|---|---|---|---|
| 2006/0113520 A1* | 6/2006 | Yamamoto et al. | 257/3 |
| 2008/0090337 A1* | 4/2008 | Williams | 438/133 |
| 2011/0024713 A1* | 2/2011 | Kamata et al. | 257/2 |
| 2012/0149164 A1 | 6/2012 | Kumar et al. | |
| 2012/0176831 A1 | 7/2012 | Xiao et al. | |

OTHER PUBLICATIONS

H. Horii et al., "A Novel Cell Technology Using N-doped GeSbTe Films for Phase Change RAM", 2003 Symposium on VLSI Technology Digest of Technical Papers, 2003, pp. 177-178.

* cited by examiner

*Primary Examiner* — Mark A Laurenzi

(57) ABSTRACT

A semiconductor device includes a first conductive layer; a second conductive layer; and a resistance variable element interposed between the first conductive layer and the second conductive layer and includes a doped first metal oxide layer and a second metal oxide layer. A density of oxygen vacancies of the second metal oxide layer is higher than that of the doped first metal oxide layer. The doped first metal oxide layer includes a doping material implanted thereto to suppress grains in the doped first metal oxide layer from increasing in size.

8 Claims, 10 Drawing Sheets

SEMICONDUCTOR DEVICE AND METHOD FOR FABRICATING THE SAME, AND MICROPROCESSOR, PROCESSOR, SYSTEM, DATA STORAGE SYSTEM AND MEMORY SYSTEM INCLUDING THE SEMICONDUCTOR DEVICE

CROSS-REFERENCE TO RELATED APPLICATION

The present application claims priority of Korean Patent Application No. 10-2013-0056397, filed on May 20, 2013, which is incorporated by reference herein in its entirety.

BACKGROUND

1. Field

Embodiments of the present invention relate to a semiconductor device and a method for fabricating the same, and more particularly, to a semiconductor device that includes a resistance variable element configured to switch between different resistance states in response to an applied voltage or current, and a method for fabricating the same.

2. Description of the Related Art

Recently, as electronic appliances trend toward miniaturization, low power consumption, high performance, and multi-functionality, semiconductor devices capable of storing information in various electronic appliances such as a computer, a portable communication device, and the like have been in high demand. Such semiconductor devices include memories which can store data using a resistance variable element to be switched between different resistance states in response to an applied voltage or current, for example, an RRAM (resistive random access memory), a PRAM (phase change random access memory), an FRAM (ferroelectric random access memory), an MRAM (magneto-resistive random access memory), an E-fuse, and the like.

SUMMARY

Various embodiments are directed to a semiconductor device which is capable of improving a switching characteristic of a resistance variable element, and a method for fabricating the same.

In an embodiment, a semiconductor device may include: a first conductive layer; a second conductive layer; and a resistance variable element which is interposed between the first conductive layer and the second conductive layer and includes a nitrogen-doped (N-doped) first metal oxide layer and a second metal oxide layer, wherein a density of oxygen vacancies of the second metal oxide layer is higher than that of the N-doped first metal oxide layer.

In an embodiment, a method for fabricating a semiconductor device may include: forming a first conductive layer; forming a N-doped first metal oxide layer over the first conductive layer; forming a second metal oxide layer over the N-doped first metal oxide layer, wherein a density of oxygen vacancies of the second metal oxide layer is higher than that of the N-doped first metal oxide layer; and forming a second conductive layer over the second metal oxide layer.

In an embodiment, a microprocessor may include: a control unit configured to receive a signal including an external command, and to perform extraction, decoding, and controlling of input and output of the external command; an operation unit configured to perform an operation in response to a signal of the control unit; and a memory unit configured to store any of (i) data for performing the operation, (ii) data corresponding to a result of performing the operation, and (iii) an address of data for which the operation is performed, wherein the memory unit comprises: a first conductive layer; a second conductive layer; and a resistance variable element which is interposed between the first conductive layer and the second conductive layer and includes an N-doped first metal oxide layer and a second metal oxide layer, wherein a density of oxygen vacancies of the second metal oxide layer is higher than that of the N-doped first metal oxide layer.

In an embodiment, a processor may include: a core unit configured to perform, in response to an external command, an operation corresponding to the external command, by using data; a cache memory unit configured to store any of (i) data for performing the operation, (ii) data corresponding to a result of performing the operation, and (iii) an address of data for which the operation is performed; and a bus interface connected between the core unit and the cache memory unit, and configured to transmit data between the core unit and the cache memory unit, wherein the cache memory unit comprises: a first conductive layer; a second conductive layer; and a resistance variable element which is interposed between the first conductive layer and the second conductive layer and includes a N-doped first metal oxide layer and a second metal oxide layer, wherein a density of oxygen vacancies of the second metal oxide layer is higher than that of the N-doped first metal oxide layer.

In an embodiment, a system may include: a processor configured to decode a command inputted from outside and control an operation for information according to a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between (i) at least one of the processor, the auxiliary memory device and the main memory device and (ii) the outside, wherein at least one of the auxiliary memory device and the main memory device comprises: a first conductive layer; a second conductive layer; and a resistance variable element which is interposed between the first conductive layer and the second conductive layer and includes an N-doped first metal oxide layer and a second metal oxide layer, wherein a density of oxygen vacancies of the second metal oxide layer is higher than that of the N-doped first metal oxide layer.

In an embodiment, a data storage system may include: a storage device configured to store data and preserve stored data regardless of power supply; a controller configured to control input and output of data to and from the storage device in response to an external command received from outside; a temporary storage device configured to temporarily store data exchanged between the storage device and the outside; and an interface configured to perform communication between (i) at least one of the storage device, the controller, and the temporary storage device and (ii) the outside, wherein at least one of the storage device and the temporary storage device comprises: a first conductive layer; a second conductive layer; and a resistance variable element which is interposed between the first conductive layer and the second conductive layer and includes an N-doped first metal oxide layer and a second metal oxide layer, wherein a density of oxygen vacancies of the second metal oxide layer is higher than that of the N-doped first metal oxide layer.

In an embodiment, a memory system may include: a memory configured to store data and preserve stored data regardless of power supply; a memory controller configured to control input and output of data to and from the memory in response to an external command received from outside; a buffer memory configured to buffer data exchanged between the memory and the outside; and an interface configured to perform communication between (i) at least one of the memory, the memory controller, and the buffer memory and (ii) the outside, wherein at least one of the memory and the buffer memory comprises: a first conductive layer; a second conductive layer; and a resistance variable element which is interposed between the first conductive layer and the second conductive layer and includes an N-doped first metal oxide layer and a second metal oxide layer, wherein a density of oxygen vacancies of the second metal oxide layer is higher than that of the N-doped first metal oxide layer.

DETAILED DESCRIPTION

Figure 1A:
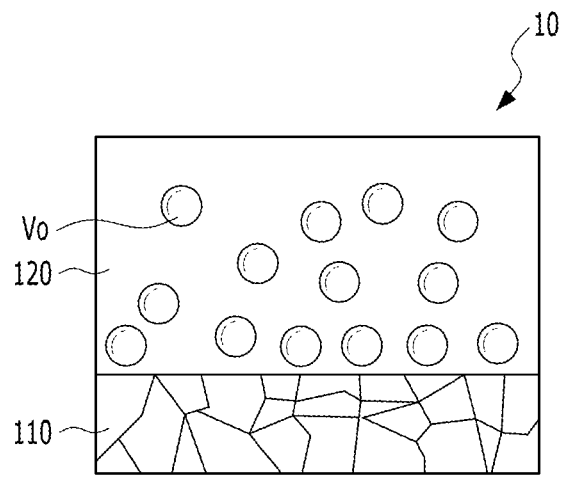
FIGS. 1A and 1B are a schematic diagram and a graph illustrating an operation mechanism and a characteristic of a resistance variable element in accordance with an embodiment, respectively.

Various embodiments will be described below in more detail with reference to the accompanying drawings. The present disclosure may, however, include embodiments in different forms and should not be construed as limited to these embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present disclosure.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 1B:
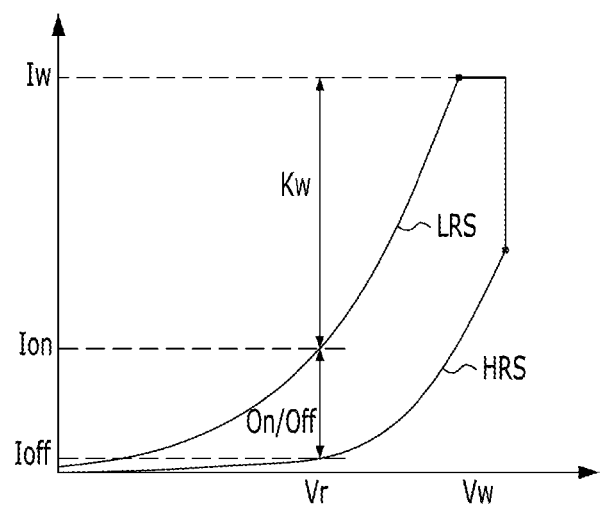
Figure 2A:
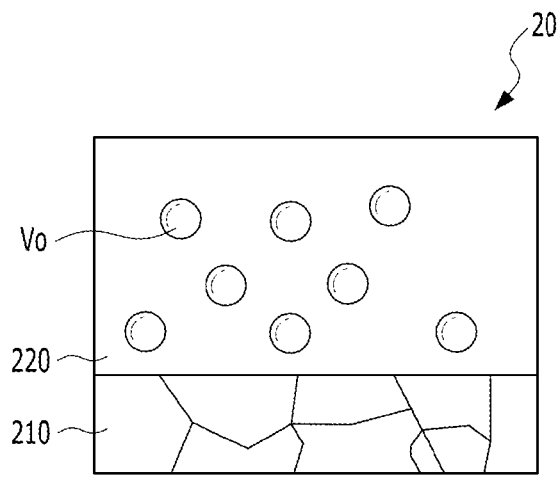
FIGS. 2A and 2B are a schematic diagram and a graph illustrating an operation mechanism and a characteristic of a resistance variable element in accordance with a comparative example, respectively.
Figure 2B:
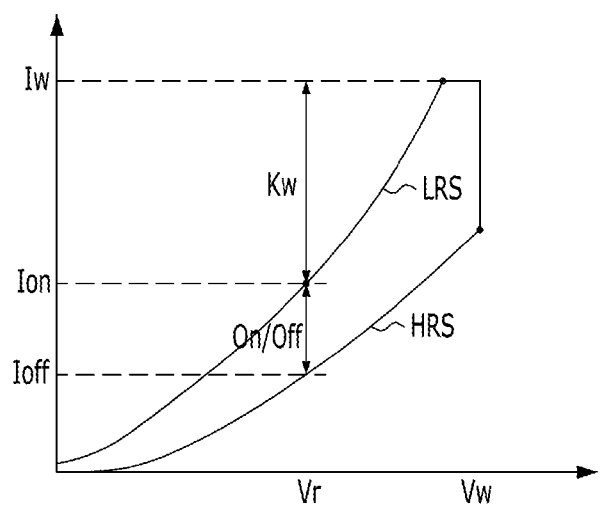

FIGS. 1A and 1B are a schematic diagram and a graph illustrating an operation mechanism and a characteristic of a resistance variable element in accordance with an embodiment. FIGS. 2A and 2B are a schematic diagram and a graph illustrating an operation mechanism and a characteristic of a resistance variable element in accordance with a comparative example. The comparative example will be described hereinafter in order to clearly describe some advantages of the resistance variable element in accordance with the embodiment shown in FIG. 1A.

Referring to FIG. 2A, in the comparative example, a resistance variable element 20 includes a stacked structure in which a first metal oxide layer 210 and a second metal oxide layer 220 are stacked.

The second metal oxide layer 220 may include a metal oxide containing two or more elements including oxygen. For example, the second metal oxide layer 220 may include one or more of Ti oxide, Ta oxide, Fe oxide, W oxide, Hf oxide, Nb oxide, Zr oxide, Ni oxide, PCMO (PrCaMnO), and the like. The second metal oxide layer 220 may include a large number of oxygen vacancies Vo. In an embodiment, the second metal oxide layer 220 may include a metal oxide which is deficient in oxygen relative to a different metal oxide which satisfies a stoichiometric ratio. For example, the second metal oxide layer 220 may include TiOx (x<2), TaOy (y<2.5), etc. The second metal oxide layer 220 may supply oxygen vacancies to the first metal oxide layer 210 in response to a voltage applied across both ends of the resistance variable element 20.

The first metal oxide layer 210 may include a metal oxide comprising two or more elements including oxygen. For example, the first metal oxide layer 210 may include one or more of Ti oxide, Ta oxide, Fe oxide, W oxide, Hf oxide, Nb oxide, Zr oxide, Ni oxide, PCMO (PrCaMnO), and the like. The first metal oxide layer 210 may include a metal oxide having a density of oxygen vacancies lower than that of the second metal oxide layer 220. For example, the first metal oxide layer 210 may include a metal oxide which satisfies a stoichiometric ratio, such as $TiO_2$, $Ta_2O_5$, etc. The first metal oxide layer 210 may correspond to a layer in which one or more current paths formed by oxygen vacancies are either present or absent based upon whether or not oxygen vacancies in the second metal oxide layer 220 are sufficiently supplied from the second metal oxide layer 220 to the first metal oxide layer 210.

Depending on whether such current path(s) are formed in the first metal oxide layer 210, switching of the resistance states of the resistance variable element 20 may occur in the first metal oxide layer 210. Specifically, the resistance variable element 20 may be in a low resistance state when oxygen vacancies in the second metal oxide layer 220 are sufficiently supplied to the first metal oxide layer 210 to create the current path formed by oxygen vacancies in the first metal oxide layer 210. On the other hand, the resistance variable element 20 may be in a high resistance state when oxygen vacancies in the second metal oxide layer 220 are not sufficiently supplied to the first metal oxide layer 210 or oxygen vacancies supplied to the first metal oxide layer 210 are removed. In the high resistance state, a current path formed by oxygen vacancies is not created in the first metal oxide layer 210.

Referring to FIG. 1A, a resistance variable element 10 in accordance with an embodiment includes a stacked structure in which a first metal oxide layer 110 and a second metal oxide layer 120 are stacked. The resistance variable element 10 of this embodiment may be different from the resistance variable element 20 of the comparative example in that the first metal oxide layer 110 is doped with any material that can suppress grains in the first metal oxide layer 110 from increasing in their size. In an embodiment, the first metal oxide layer 110 is doped with nitrogen (N). For example, nitrogen contained in the N-doped first metal oxide layer 110 may suppress the growth of grains in the N-doped first metal oxide layer 110, thereby reducing grain sizes. As a result, the total area of grain boundaries in the N-doped first metal oxide layer 110 may increase.

The N-doped first metal oxide layer 110 of this embodiment has smaller grains sizes and more grain boundaries than the grain sizes and grain boundaries in the first metal oxide layer 210 of the comparative example. As a result, a switching resistance characteristic of the resistance variable element 10 of this embodiment is improved compared to that of the resistance variable element 20 of the comparative example. Reasons for the improvement will be further described below in detail with reference to FIGS. 1B and 2B.

Referring to FIGS. 1B and 2B, the resistance variable elements 10 and 20 may be switched between a low resistance state (LRS) and a high resistance state (HRS). Initially, a voltage across both ends of the resistance variable elements 10 and 20 is applied in a positive direction and is increased from approximately 0V to a predetermined positive voltage Vw. When the voltage reaches approximately the predetermined positive voltage Vw, a resistance state for each of the resistance variable elements 10 and 20 is changed from the high resistance state (HRS) to the low resistance state (LRS). The predetermined positive voltage Vw may be referred to as a writing voltage Vw. The low resistance state (LRS) for each of the resistance variable elements 10 and 20 may be maintained unless a different voltage (not shown) which can change the low resistance state (LRS) for each of the resistance variable elements 10 and 20 into the high resistance state (HRS) is applied. In an embodiment, the different voltage may be applied in a negative direction across the both ends of the resistance variable elements 10 and 20, so that the different voltage has an opposite polarity to the writing voltage Vw.

For example, a reading voltage Vr used in reading a resistance state of the resistance variable elements 10 and 20 may be about half of the writing voltage Vw. When the reading voltage Vr is applied, currents flowing through each of the resistance variable elements 10 and 20 in the high resistance state (HRS) and in the low resistance state (LRS) are referred to as an off current (Ioff) and an on current (Ion), respectively. A difference between the magnitude of the on current Ion and that of the off current Ioff is represented by the reference character on/off. Also, when the writing voltage Vw is applied, a current flowing through each of the resistance variable elements 10 and 20 in the low resistance state (LRS) is referred to as a writing current Iw, and a difference between the magnitude of the writing current Iw and that of the on current Ion is represented by the reference character Kw.

Referring again to FIGS. 1B and 2B, a curve illustrating the resistance states of the resistance variable element 10 of this embodiment is more non-linear than a curve illustrating the resistance states of the resistance variable element 20 of the comparative example. In an embodiment, the curve illustrating the resistance states of the resistance variable element 10 of this embodiment increases at a slower rate in the range of low voltage levels (e.g., below the reading voltage Vr) than that in the range of high voltage levels (e.g., above the reading voltage Vr). This is because the total area of grain boundaries in the N-doped first metal oxide layer 110 of this embodiment is larger than that in the first metal oxide layer 210 of the comparative example. Since grain boundaries may interrupt the flow of an electric current, the N-doped first metal oxide layer 110 may have a higher resistance than the first metal oxide layer 210 particularly when a low voltage is applied. Therefore, a level of current flowing through the resistance variable element 10 may be lower than a level of current flowing through the resistance variable element 20 at low voltage levels (e.g., below the reading voltage Vr). In an embodiment implementing a cross-point structure which will be described below (see FIGS. 5A and 5B), sneak currents flowing through unselected cells to which a low voltage is applied may be reduced due to the high resistance characteristic. As a result, an operational characteristic of the cross-point structure may be improved. Also, due to the reduced sneak currents, a selector (e.g., a diode) to suppress the sneak currents flowing through the unselected cells may not be required, thereby simplifying fabrication processes and reducing manufacturing costs.

Due to the non-linearity of the resistance states of the resistance variable element 10, the difference (On/Off) between the magnitude of the on current Ion and that of the off current Ioff of the resistance variable element 10 may be larger than that (On/Off) of the resistance variable element 20. Therefore, a reading margin of the resistance variable element 10 may be increased when compared to that of the resistance variable element 20. Similarly, the difference (Kw) between the magnitude of the writing current (Iw) and that of the on current (Ion) of the resistance variable element 10 may be increased for the resistance variable element 10 when compared to the resistance variable element 20.

Furthermore, since the total area of the grain boundaries of the N-doped first metal oxide layer 110 is larger than that of the first metal oxide layer 210, the oxygen vacancies of the second metal oxide layer 120 may become more concentrated near an interface with the first metal oxide layer 110, when compared to the comparative example. In this case, the second metal oxide layer 120 may include a first portion adjacent to the first metal oxide layer 110 and a second portion which occupies the remainder of the second metal oxide layer 120. A density of oxygen vacancies in the first portion may be higher than that of the second portion. In this way, oxygen vacancies from the second metal oxide layer 120 may be sufficiently and stably supplied to the first metal oxide layer 110 so that the number of current paths created in the first metal oxide layer 110 may be increased. In this way, a switching speed may be increased and the switching properties of the resistance variable element 10 may be improved.

Figure 3A:
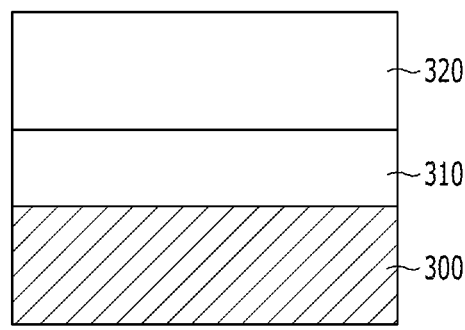
FIGS. 3A to 3C are cross-sectional views illustrating a method for fabricating a semiconductor device in accordance with an embodiment.
Figure 3B:
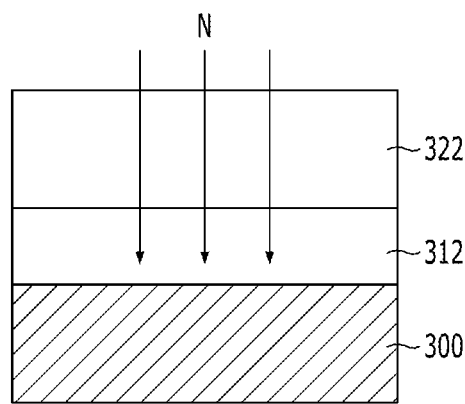
Figure 3C:
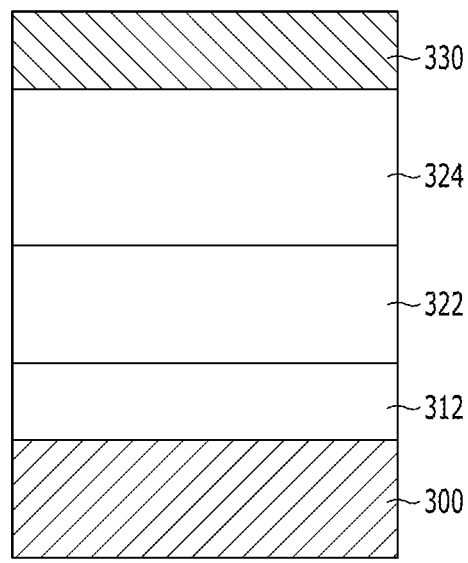

FIGS. 3A to 3C are cross-sectional views illustrating a method for fabricating a semiconductor device in accordance with an embodiment.

Referring to FIG. 3A, a first conductive layer 300 is formed. The first conductive layer 300 may be used to apply voltages to a resistance variable element and a second conductive layer 330 (see FIG. 3C). This will be described below. The first conductive layer 300 may include a conductive material. For example, the first conductive layer 300 may include a metal such as platinum (Pt), tungsten (W), aluminum (Al), copper (Cu), or tantalum (Ta); or a metal nitride such as a titanium nitride (TiN) or a tantalum nitride (TaN).

Thereafter, a first metal oxide layer 310 is formed over the first conductive layer 300. The first metal oxide layer 310 may include a metal oxide having a relatively low density of oxygen vacancies. For example, the first metal oxide layer 310 may include a metal oxide which satisfies a stoichiometric ratio. In an embodiment, the first metal oxide layer 310 may be formed by a deposition process such as Chemical Vapor Deposition (CVD), Atomic Layer Deposition (ALD), or the like.

Thereafter, a second metal oxide layer 320 is formed over the first metal oxide layer 310. The second metal oxide layer 320 may include a metal oxide having a relatively high density of oxygen vacancies. For example, the first metal oxide layer 310 may include a metal oxide which is deficient in oxygen when compared to the metal oxide which satisfies the stoichiometric ratio. In an embodiment, the second metal oxide layer 320 may be formed by a deposition process such as Physical Vapor Deposition (PVD), ALD, or the like.

Referring to FIG. 3B, an N-doped first metal oxide layer 312 is formed by implanting nitrogen dopants into the first metal oxide layer 310. The N-doped first metal oxide layer 312 may substantially correspond to the N-doped first metal oxide layer 110 in FIG. 1A. During the implantation process, the second metal oxide layer 320 may function as a buffer layer, and thus have a relatively thin thickness. During the implantation process, since the second metal oxide layer 320 may be also doped with a small amount of nitrogen, a chemical or physical characteristic of the second metal oxide layer 320 may be changed. Hereinafter, the second metal oxide layer 320 after the implanting process is referred to as an implanted second metal oxide layer 322.

Referring to FIG. 3C, a third metal oxide layer 324 is formed over the implanted second metal oxide layer 322. In an embodiment, the third metal oxide layer 324 is formed of substantially the same material as the second metal oxide layer 320. Also, the third metal oxide layer 324 may be formed by substantially the same deposition process as the second metal oxide layer 320. The implanted second metal oxide layer 322 and the third metal oxide layer 324 substantially correspond to the second metal oxide layer 120 of FIG. 1A. In an embodiment, the third metal oxide layer 324 is thicker than the second metal oxide layer 320 in order to satisfy a desired oxygen vacancy density.

Thereafter, the second conductive layer 330 is formed over the third metal oxide layer 324.

As a result, a resistance variable element which substantially corresponds to the resistance variable element 10 of FIG. 1A and conductive layers used to apply voltages to both ends of the resistance variable element are formed.

Figure 4A:
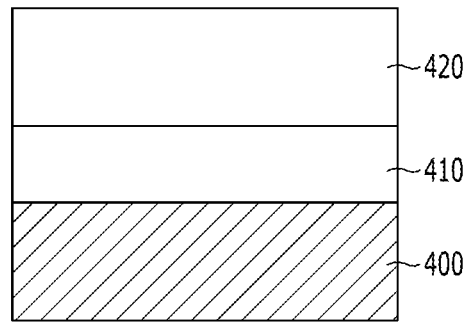
FIGS. 4A to 4C are cross-sectional views illustrating a method for fabricating a semiconductor device in accordance with another embodiment.
Figure 4B:
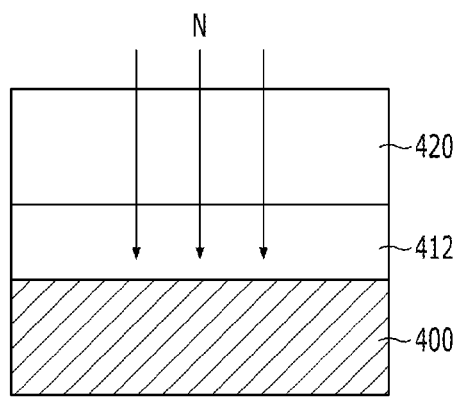
Figure 4C:
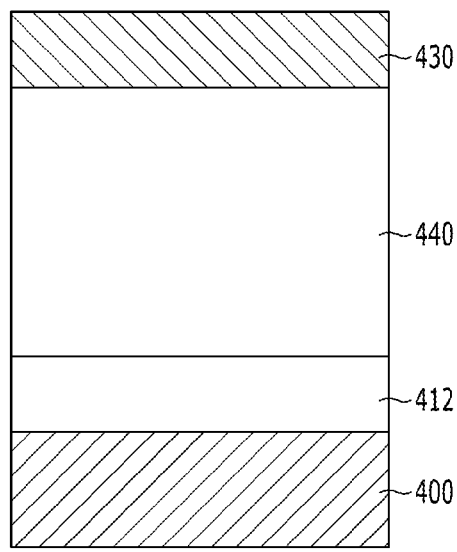

FIGS. 4A to 4C are cross-sectional views illustrating a method for fabricating a semiconductor device in accordance with another embodiment.

Referring to FIG. 4A, a first conductive layer 400 is formed, and then a first metal oxide layer 410 is formed over the first conductive layer 400. In an embodiment, the first metal oxide layer 410 includes a metal oxide having a relatively low oxygen vacancy. For example, the first metal oxide layer 410 may include a metal oxide which satisfies a stoichiometric ratio.

Thereafter, a buffer layer 420 is formed over the first metal oxide layer 410. Various types of materials such as an insulating material, a conductive material, a semiconductor material, a metal oxide, and the like may be used to form the buffer layer 420.

Referring to FIG. 4B, an N-doped first metal oxide layer 412 is formed by implanting nitrogen dopants into the first metal oxide layer 410.

Thereafter, referring to FIG. 4C, the buffer layer 420 is removed.

Thereafter, a second metal oxide layer 440 is formed over the N-doped first metal oxide layer 412. The second metal oxide layer 440 substantially corresponds to the second metal oxide layer 120 of FIG. 1A. Subsequently, a second conductive layer 430 is formed over the second metal oxide layer 440.

Figure 5A:
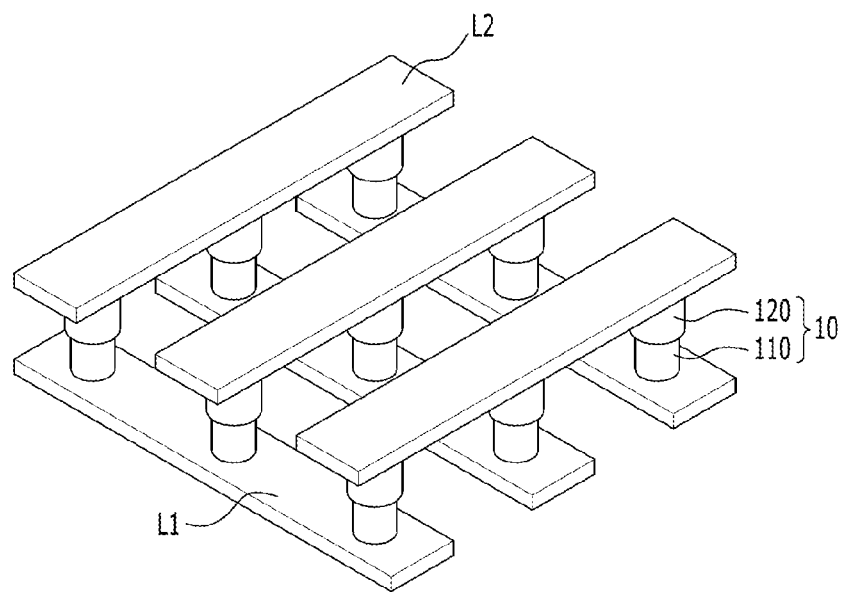
FIG. 5A is a perspective view illustrating a semiconductor device in accordance with an embodiment.
Figure 5B:
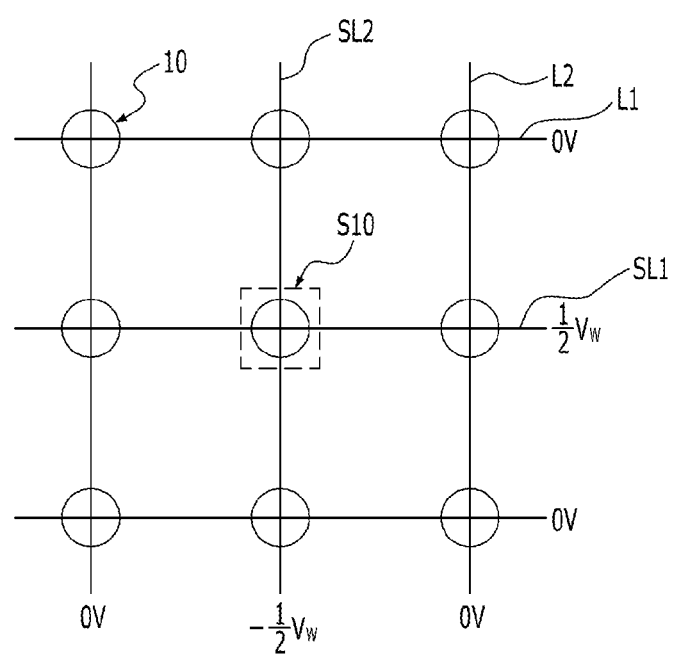
FIG. 5B is a diagram illustrating how voltages are applied to lower lines and upper lines in a writing operation of the semiconductor device of FIG. 5A.

FIG. 5A is a perspective view illustrating a semiconductor device in accordance with an embodiment. FIG. 5B is a diagram illustrating how voltages are applied to lower lines and upper lines in a writing operation of the semiconductor device of FIG. 5A.

Referring to FIG. 5A, the semiconductor device in accordance with this embodiment includes the lower lines L1 which are formed over a substrate (not shown) and extend in a first direction, the upper lines L2 which are formed over the lower lines L1 and extend in a second direction crossing the first direction, and resistance variable elements 10 which are interposed between the lower lines L1 and the upper lines L2 at intersections of the lower lines L1 and the upper lines L2. Thus, a cross-point structure is implemented.

Here, each of the resistance variable elements 10 of this embodiment substantially corresponds to the resistance variable element 10 of FIG. 1A, and includes an N-doped first metal oxide layer 110 and a second metal oxide layer 120.

In this embodiment, each of the lower lines L1 corresponds to the first conductive layer 300 of FIG. 3C, and each of the upper lines L2 corresponds to the second conductive layer 330 of FIG. 3C.

In another embodiment, electrodes (not shown) are formed over and under the resistance variable element 10. The electrodes may be patterned together with the resistance variable element 10, so that the electrodes may have substantially the same planar shape as that of the resistance variable element 10. The electrodes disposed under and over the resistance variable element 10 correspond to the first conductive layer 300 and the second conductive layer 330 of FIG. 3C, respectively. In this case, the electrodes disposed under and over the resistance variable element 10 are formed over the lower lines L1 and under the upper lines L2, respectively.

FIG. 5B illustrates an example of how voltages are applied to a lower line SL1 and an upper line SL2 that are coupled to a selected resistance variable element S10, when a writing operation to change a resistance state of the selected resistance variable element 10 is performed. In this case, a voltage ($\frac{1}{2}$)Vw corresponding to half of a writing voltage Vw is applied to the selected lower line SL1, and a voltage $-(\frac{1}{2})$Vw corresponding to a negative half of the writing voltage Vw is applied to the selected upper line SL2. Therefore, a difference between the two voltages ($\frac{1}{2}$)Vw and $-(\frac{1}{2})$Vw corresponds to the writing voltage Vw and is applied to the selected resistance variable element S10. On the other hand, approximately 0V is applied to remaining lower lines L1 and remaining upper lines L2, i.e., unselected lower lines and upper lines coupled to unselected resistance variable elements. In this case, the voltage level corresponding to ($\frac{1}{2}$)Vw or $-(\frac{1}{2})$Vw is applied to unselected resistance variable elements which share the selected lower line SL1 or the selected upper line SL2 with the selected resistance variable element S10. As a result, when a reading voltage Vr (see FIGS. 1B and 2B) approximately corresponds to a half of the writing voltage Vw, a voltage similar to the reading voltage Vr is applied to the unselected resistance variable elements which share the selected lower line SL1 or the selected upper line SL2 coupled to the selected resistance variable element S10. Referring again to FIGS. 1B and 2B, the on current (Ion) and the off current (Ioff) of the resistance variable element 10 near the reading voltage Vr are lower than those of the comparative example. In this way, sneak currents flowing through the unselected resistance variable elements which share the selected lower line SL1 or the selected upper line SL2 coupled to the selected resistance variable element S10 may be reduced, even if the voltage similar to the reading voltage Vr is applied to the unselected resistance variable elements in the cross-point structure.

Figure 6:
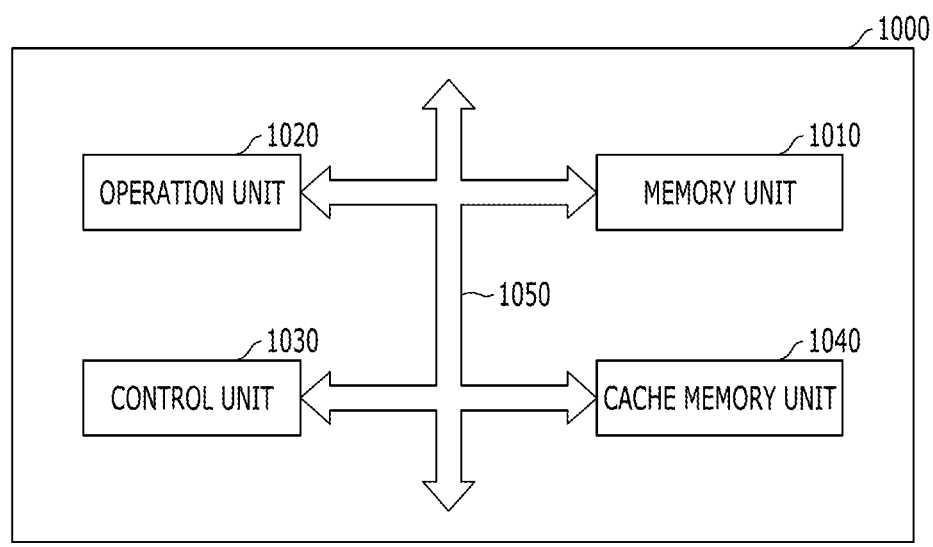
FIG. 6 is a configuration diagram of a microprocessor in accordance with an embodiment.

FIG. 6 is a configuration diagram of a microprocessor in accordance with an embodiment.

Referring to FIG. 6, a microprocessor 1000 may perform tasks for controlling and tuning a series of processes of receiving data from various external devices, processing the data, and outputting processing results to external devices. The microprocessor 1000 may include a memory unit 1010, an operation unit 1020 and a control unit 1030. The microprocessor 1000 may be various types of processing units such as a central processing unit (CPU), a graphic processing unit (GPU), a digital signal processor (DSP) and an application processor (AP).

The memory unit 1010 is a part which stores data in the microprocessor 1000, as a processor register or a register. The memory unit 1010 may include a data register, an address register and a floating point register. In addition, the memory unit 1010 may include various registers. The memory unit 1010 may perform the function of temporarily storing data for which operations are to be performed by the operation unit 1020, result data from performing the operations and an address where data for performing of the operations are stored.

The memory unit 1010 may include one of the above-described semiconductor devices. The memory unit 1010 including a semiconductor device as described herein may include a first conductive layer; a second conductive layer; and a resistance variable element which is interposed between the first conductive layer and the second conductive layer and includes an N-doped first metal oxide layer and a second metal oxide layer, wherein a density of oxygen vacancies of the second metal oxide layer is higher than that of the N-doped first metal oxide layer. Through this, a characteristic of the memory unit 1010 may be improved. As a consequence, a characteristic of the microprocessor 1000 may be improved.

The operation unit 1020 is a part which performs operations in the microprocessor 1000. The operation unit 1020 performs arithmetical operations or logical operations according to signals transmitted from the control unit 1030. The operation unit 1020 may include at least one arithmetic logic unit (ALU).

The control unit 1030 receives signals from the memory unit 1010, the operation unit 1020 and an external device of the microprocessor 1000, performs extraction, decoding and controlling upon input and output of commands, and executes processing represented by programs.

The microprocessor 1000 according to the present embodiment may additionally include a cache memory unit 1040 which can temporarily store data to be inputted from an external device or to be outputted to an external device. In this case, the cache memory unit 1040 may exchange data with the memory unit 1010, the operation unit 1020 and the control unit 1030 through a bus interface 1050.

Figure 7:
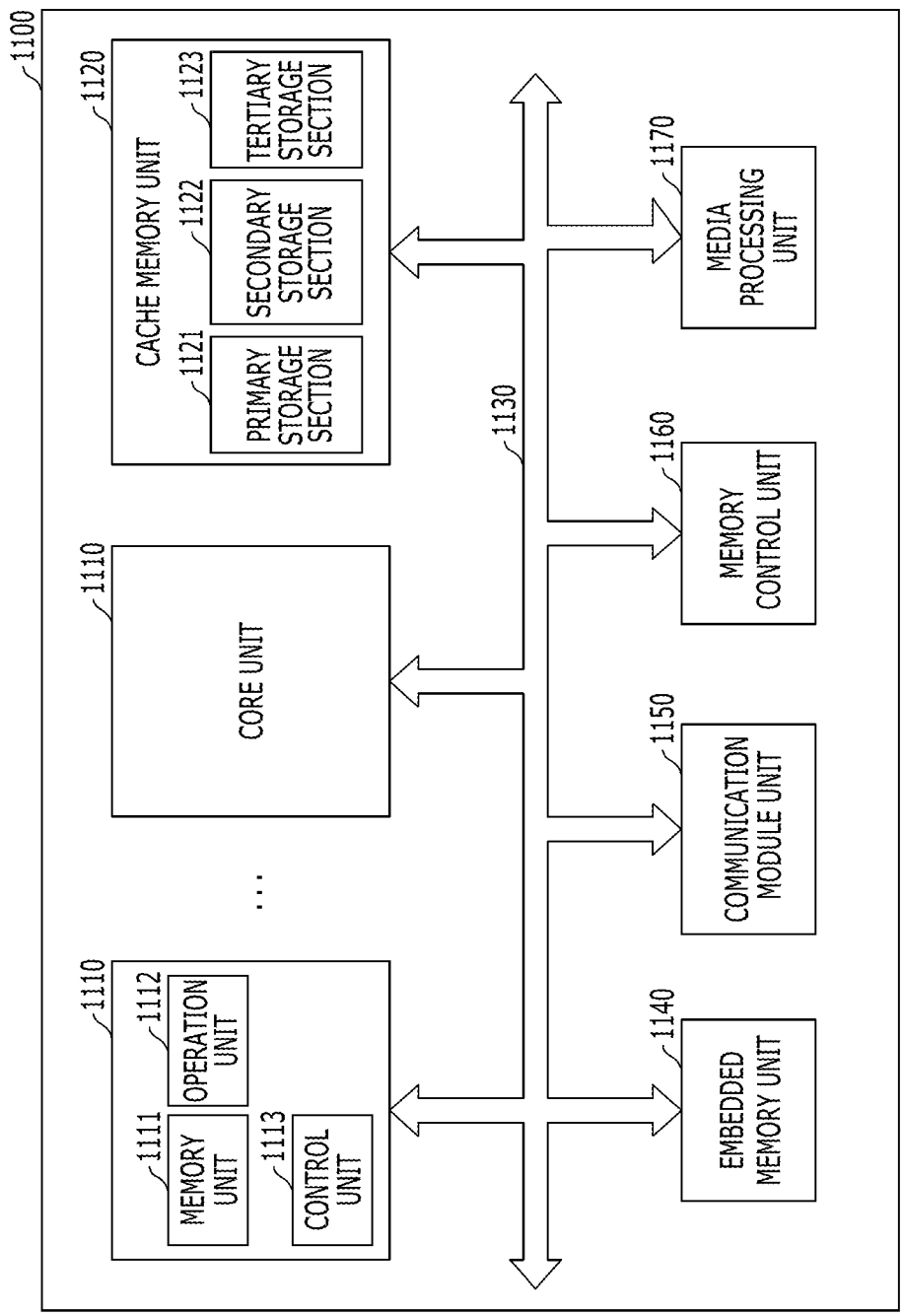
FIG. 7 is a configuration diagram of a processor in accordance with an embodiment.

FIG. 7 is a configuration diagram of a processor in accordance with an embodiment.

Referring to FIG. 7, a processor 1100 may improve performance and realize multi-functionality by including various functions in addition to controlling and tuning a series of processes of receiving data from various external devices, processing the data, and outputting processing results to external devices. The processor 1100 may include a core unit 1110, a cache memory unit 1120, and a bus interface 1130. The core unit 1110 is a part which performs arithmetic logic operations for data inputted from an external device, and may include a memory unit 1111, an operation unit 1112 and a control unit 1113. The processor 1100 may be various system-on-chips (SoCs) such as a multi-core processor, a graphic processing unit (GPU) and an application processor (AP).

The memory unit 1111 is a component which stores data in the processor 1100, as a processor register or a register. The memory unit 1111 may include a data register, an address register and a floating point register. In addition, the memory unit 1111 may include various registers. The memory unit 1111 may perform the function of temporarily storing (i) data for which operations are to be performed by the operation unit 1112, (ii) result data obtained by performing the operations and (iii) an address where data for performing of the operations are stored. The operation unit 1112 is a component which performs operations in the processor 1100. The operation unit 1112 performs arithmetical operations or logical operations in response to signals from the control unit 1113. The operation unit 1112 may also include at least one arithmetic logic unit (ALU). The control unit 1113 receives signals from the memory unit 1111, the operation unit 1112, and an external device of the processor 1100, performs extraction, decoding, controlling upon input and output of commands, and executes processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122, and a tertiary storage section 1123. In general, the cache memory unit 1120 includes the primary and secondary storage sections 1121 and 1122, and may include the tertiary storage section 1123 when high storage capacity is desired. When appropriate, the cache memory unit 1120 may include an increased number of storage sections. That is to say, the number of storage sections which are included in the cache memory unit 1120 may be changed according to a chip design. The speeds at which the primary, secondary, and tertiary storage sections 1121, 1122 and 1123 store and discriminate data may be substantially the same or different. In the case where the speeds of the respective storage sections 1121, 1122 and 1123 are different, the speed of the primary storage section 1121 may be set to be the fastest. At least one storage section of the primary storage section 1121, the secondary storage section 1122, and the tertiary storage section 1123 of the cache memory unit 1120 may include one of the above-described semiconductor devices. The cache memory unit 1120 including the semiconductor device in accordance with an embodiment may include a first conductive layer; a second conductive layer; and a resistance variable element which is interposed between the first conductive layer and the second conductive layer and includes an N-doped first metal oxide layer and a second metal oxide layer, wherein a density of oxygen vacancies of the second metal oxide layer is higher than that of the N-doped first metal oxide layer. Through this, a characteristic of the cache memory unit 1120 may be improved. As a consequence, a characteristic of the processor 1100 may be improved.

Although it was shown in FIG. 7 that all the primary, secondary, and tertiary storage sections 1121, 1122 and 1123 are configured inside the cache memory unit 1120, the embodiments are not limited thereto. For example, it is to be noted that all the primary, secondary, and tertiary storage sections 1121, 1122 and 1123 of the cache memory unit 1120 may be configured outside the core unit 1110 and may compensate for a difference in data processing speed between the core unit 1110 and the external device. For another example, the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed.

The bus interface 1130 is a part which connects the core unit 1110 and the cache memory unit 1120 for effective transmission of data.

Figure 8:
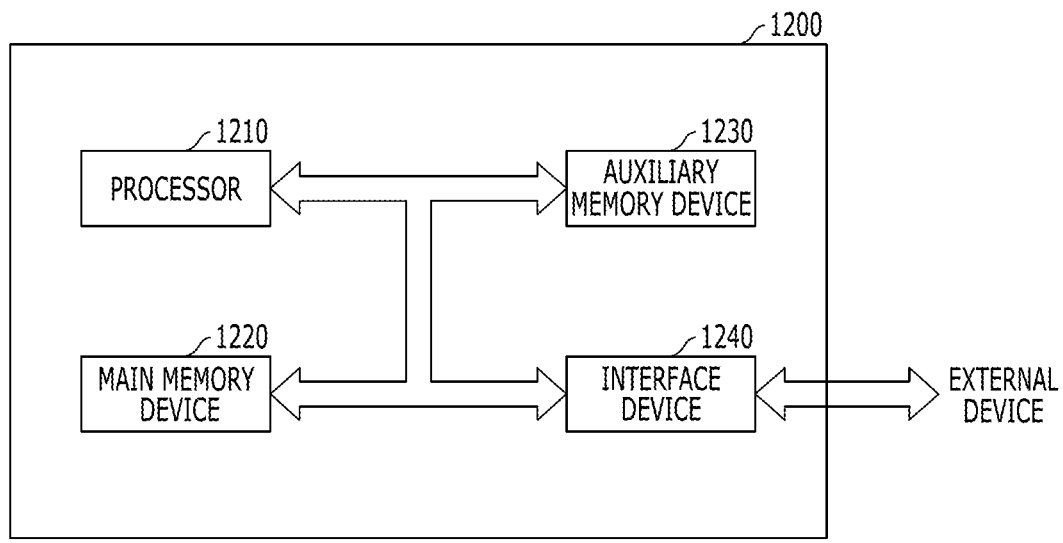
FIG. 8 is a configuration diagram of a system in accordance with an embodiment.

As shown in FIG. 8, the processor 1100 according to an embodiment may include a plurality of core units 1110, and the plurality of core units 1110 may share the same cache memory unit 1120. The plurality of core units 1110 and the cache memory unit 1120 may be connected through the bus interface 1130. The plurality of core units 1110 may be configured in substantially the same way as the above-described configuration of the core unit 1110. In the case where the processor 1100 includes the plurality of core units 1110, the primary storage section 1121 of the cache memory unit 1120 may be configured in each core unit 1110, and the secondary storage section 1122 and the tertiary storage section 1123 may be configured outside the plurality of core units 1110 in such a way as to be shared through the bus interface 1130. In an embodiment, the processing speed of the primary storage section 1121 may be faster than the processing speeds of the secondary and tertiary storage section 1122 and 1123.

The processor 1100 may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device. In addition, the processor 1100 may include a plurality of modules. In this case, the plurality of modules which are added may exchange data with the core units 1110, the cache memory unit 1120, and other units, through the bus interface 1130.

The embedded memory unit 1140 may include not only a volatile memory but also a nonvolatile memory. The volatile memory may include a dynamic random access memory (DRAM), a mobile DRAM, a static random access memory (SRAM), and the like. The nonvolatile memory may include a read only memory (ROM), a NOR flash memory, a NAND flash memory, a phase change random access memory (PRAM), a resistive random access memory (RRAM), a spin transfer torque random access memory (STTRAM), a magneto-resistive random access memory (MRAM), and so on.

The communication module unit 1150 may include both a module capable of being connected with a wired network and a module capable of being connected with a wireless network. The wired network module may include a local area network (LAN), a universal serial bus (USB), an Ethernet, power line communication (PLC), and the like. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), and the like.

The memory control unit 1160 is to administrate data transmitted between the processor 1100 and an external storage device operating according to a different communication standard. The memory control unit 1160 may include various memory controllers, for example, controllers for controlling IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The media processing unit 1170 processes the data processed in the processor 1100 or the data inputted from the external input device and output the processed data to the external interface device to be transmitted in the forms of image, voice and others, and may include a graphic processing unit (GPU), a digital signal processor (DSP), a high definition audio (HD audio), a high definition multimedia interface (HDMI) controller, and the like.

FIG. 8 is a configuration diagram of a system in accordance with an embodiment.

Figure 10:
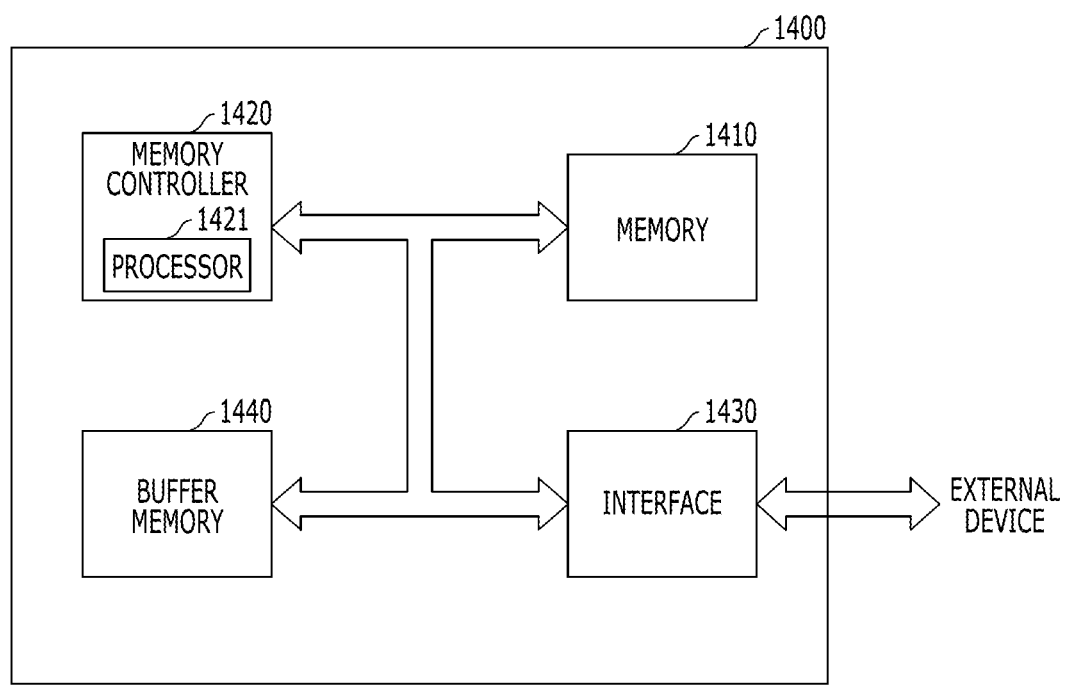
FIG. 10 is a configuration diagram of a memory system in accordance with an embodiment.

Referring to FIG. 10, a system 1200 as an apparatus for processing data may perform input, processing, output, communication, storage, etc. to conduct a series of manipulations on data. The system 1200 may include a processor 1210, a main memory device 1220, an auxiliary memory device 1230, and an interface device 1240. The system 1200 of this embodiment may comprise one of various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and the like.

The processor 1210 controls decoding of inputted commands and processing such as operation, comparison, etc. for the data stored in the system 1200, and may comprise a microprocessor unit (MPU), a central processing unit (CPU), a single/multi-core processor, a graphic processing unit (GPU), an application processor (AP), a digital signal processor (DSP), and the like.

The main memory device 1220 is a memory which can call and execute programs or data from the auxiliary memory device 1230 when programs are executed and can conserve memorized contents even when power supply is cut off. The main memory device 1220 may include one of the above-described semiconductor devices. The main memory device 1220 including a semiconductor device as described herein may include a first conductive layer; a second conductive layer; and a resistance variable element which is interposed between the first conductive layer and the second conductive layer and includes an N-doped first metal oxide layer and a second metal oxide layer, wherein a density of oxygen vacancies of the second metal oxide layer is higher than that of the N-doped first metal oxide layer. Through this, a characteristic of the main memory device 1220 may be improved. As a consequence, a characteristic of the system 1200 may be improved. Also, the main memory device 1220 may further include a volatile memory such as a static random access memory (SRAM), a dynamic random access memory (DRAM), and the like in which all contents are erased when power supply is cut off. Unlike this, the main memory device 1220 may not include a semiconductor devices as described herein, but may include a static random access memory (SRAM), a dynamic random access memory (DRAM), and on the like, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one of the above-described semiconductor devices in accordance with the embodiments. The auxiliary memory device 1230 including the semiconductor device in accordance with the aforementioned embodiment may include a first conductive layer; a second conductive layer; and a resistance variable element which is interposed between the first conductive layer and the second conductive layer and includes a N-doped first metal oxide layer and a second metal oxide layer, wherein a density of oxygen vacancies of the second metal oxide layer is higher that of the N-doped first metal oxide layer. Through this, a characteristic of the auxiliary memory device 1230 may be improved. As a consequence, a characteristic of the system 1200 may be improved.

Also, the auxiliary memory device 1230 may further include a data storage system (see the reference numeral 1300 of FIG. 9) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like. Unlike this, the auxiliary memory device 1230 may not include the semiconductor devices according to the embodiments, but may include data storage systems (see the reference numeral 1300 of FIG. 9) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The interface device 1240 may be to perform exchange of commands and data between the system 1200 of the present embodiment and an external device. The interface device 1240 may be a keypad, a keyboard, a mouse, a speaker, a mike, a display, various human interface devices (HIDs), and a communication device. The communication device may include both a module capable of being connected with a wired network and a module capable of being connected with a wireless network. The wired network module may include a local area network (LAN), a universal serial bus (USB), an Ethernet, power line communication (PLC), and the like. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), and the like.

Figure 9:
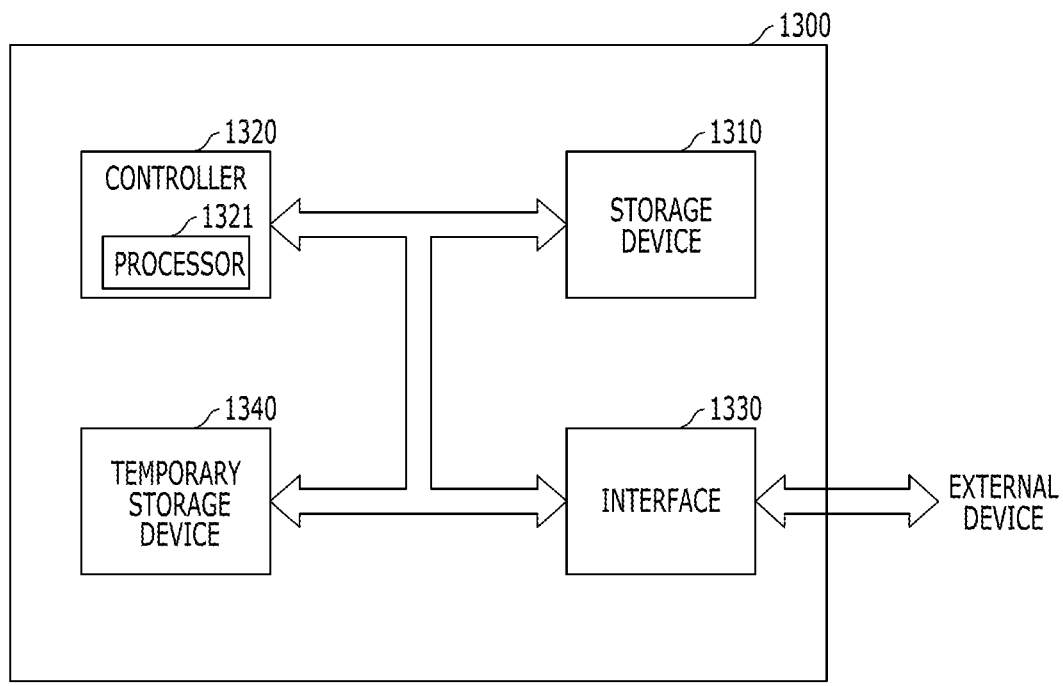
FIG. 9 is a configuration diagram of a data storage system in accordance with an embodiment.

FIG. 9 is a configuration diagram of a data storage system in accordance with an embodiment.

Referring to FIG. 9, a data storage system 1300 may include a storage device 1310 which has a nonvolatile characteristic as a component for storing data, a controller 1320 which controls the storage device 1310, and an interface 1330 for connection with an external device. The data storage system 1300 may be a disk type such as a hard disk drive (HDD), a compact disc read only memory (CDROM), a digital versatile disc (DVD), a solid state disk (SSD), and the like, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The controller 1320 may control exchange of data between the storage device 1310 and the interface 1330. To this end, the controller 1320 may include a processor 1321 for performing an operation for and processing commands inputted through the interface 1330 from an outside of the data storage system 1300.

The interface 1330 is to perform exchange of commands and data between the data storage system 1300 and the external device. In the case where the data storage system 1300 is a card type, the interface 1330 may be an interface which is compatible with a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC) , an embedded MMC (eMMC), a compact flash (CF) card, and the like. In the case where the data storage system 1300 is a disk type, the interface 1330 may be an interface which is compatible with IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and the like.

The data storage system 1300 according to the present embodiment may further include a temporary storage device 1340 for efficiently transferring data between the interface 1330 and the storage device 1310 according to diversification and high performance of an interface with an external device, a controller and a system. The storage device 1310 and the temporary storage device 1340 for temporarily storing data may include one of the above-described semiconductor devices in accordance with the embodiments. The storage device 1310 or the temporary storage device 1340 including the semiconductor device in accordance with the aforementioned embodiment may include a first conductive layer; a second conductive layer; and a resistance variable element which is interposed between the first conductive layer and the second conductive layer and includes a N-doped first metal oxide layer and a second metal oxide layer, wherein a density of oxygen vacancies of the second metal oxide layer is higher that of the N-doped first metal oxide layer. Through this, a characteristic of the storage device 1310 or the temporary storage device 1340 may be improved. As a consequence, a characteristic of the data storage system 1300 may be improved.

FIG. 10 is a configuration diagram of a memory system in accordance with an embodiment.

Referring to FIG. 10, a memory system 1400 may include a memory 1410 which has a nonvolatile characteristic as a component for storing data, a memory controller 1420 which controls the memory 1410, and an interface 1430 for connection with an external device. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The memory 1410 for storing data may include one of the above-described semiconductor devices in accordance with the embodiments. The memory 1410 including the semiconductor device in accordance with the aforementioned embodiment may include a first conductive layer; a second conductive layer; and a resistance variable element which is interposed between the first conductive layer and the second conductive layer and includes a N-doped first metal oxide layer and a second metal oxide layer, wherein a density of oxygen vacancies of the second metal oxide layer is higher that of the N-doped first metal oxide layer. Through this, a characteristic of the memory 1410 may be improved. As a consequence, a characteristic of the memory system 1400 may be improved. Also, the memory 1410 according to the present embodiment may further include a ROM (read only memory), a NOR flash memory, a NAND flash memory, a phase change random access memory (PRAM), a resistive random access memory (RRAM), a magneto-resistive random access memory (MRAM), and the like, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The memory system 1400 according to the present embodiment may further include a buffer memory 1440 for efficiently transferring data between the interface 1430 and the memory 1410 according to diversification and high performance of an interface with an external device, a memory controller and a memory system. The buffer memory 1440 for temporarily storing data may include one of the above-described semiconductor devices in accordance with the embodiments.

The buffer memory 1440 including the semiconductor device in accordance with the aforementioned embodiment may include a first conductive layer; a second conductive layer; and a resistance variable element which is interposed between the first conductive layer and the second conductive layer and includes a N-doped first metal oxide layer and a second metal oxide layer, wherein a density of oxygen vacancies of the second metal oxide layer is higher that of the N-doped first metal oxide layer. Through this, a characteristic of the buffer memory 1440 may be improved. As a consequence, a characteristic of the memory system 1400 may be improved.

Moreover, the buffer memory 1440 according to the present embodiment may further include an SRAM (static random access memory), a DRAM (dynamic random access memory), and the like, which have a volatile characteristic, and a phase change random access memory (PRAM), a resistive random access memory (RRAM), a spin transfer torque random access memory (STTRAM), a magneto-resistive random access memory (MRAM), and the like, which have a nonvolatile characteristic.

Unlike this, the buffer memory 1440 may not include the semiconductor devices according to the embodiments, but may include an SRAM (static random access memory), a DRAM (dynamic random access memory), and the like, which have a volatile characteristic, and a phase change random access memory (PRAM), a resistive random access memory (RRAM), a spin transfer torque random access memory (STTRAM), a magneto-resistive random access memory (MRAM), and the like, which have a nonvolatile characteristic.

As is apparent from the above descriptions, in the semiconductor device and the method for fabricating the same in accordance with the above-described embodiments, a fabrication process of the semiconductor device is simplified, and interference between neighboring cells may be reduced.

Although various embodiments have been described for illustrative purposes, it will be apparent to those skilled in the art that various changes and modifications may be made without departing from the spirit and scope of the present disclosure as defined in the following claims.

What is claimed is:

1. A semiconductor device comprising:
 a first conductive layer;
 a second conductive layer; and
 a resistance variable element interposed between the first conductive layer and the second conductive layer, and including a stacked structure of a doped first metal oxide layer and a second metal oxide layer,
 wherein the doped first metal oxide layer is disposed closer to the first conductive layer than the second metal oxide layer, and the second metal oxide layer is disposed closer to the second conductive layer than the doped first metal oxide layer,
 wherein a density of oxygen vacancies of the second metal oxide layer is higher than that of the doped first metal oxide layer, and
 wherein the doped first metal oxide layer comprises a doping material implanted thereto to suppress grains in the doped first metal oxide layer from increasing in size.

2. The semiconductor device of claim 1, wherein the doping material includes nitrogen.

3. The semiconductor device of claim 1, wherein the second metal oxide layer includes a first portion adjacent to the doped first metal oxide layer and a second portion which occupies the remainder of the second metal oxide layer, and
 wherein a density of oxygen vacancies of the first portion is higher than that of the second portion.

4. The semiconductor device of claim 3, wherein the first portion of the second metal oxide layer comprises nitrogen.

5. The semiconductor device of claim 1, wherein the doped first metal oxide layer satisfies a stoichiometric ratio, and
 wherein the second metal oxide layer is deficient in oxygen relative to the doped first metal oxide layer.

6. The semiconductor device of claim 1, wherein the first conductive layer comprises a first conductive line extending in a first direction,
 wherein the second conductive layer comprises a second conductive line extending in a second direction crossing the first direction, and wherein the resistance variable element is disposed at an intersection of the first conductive line and the second conductive line.

7. The semiconductor device of claim 5, wherein the doped first metal oxide layer includes $TiO_2$ or $Ta_2O_5$.

8. The semiconductor device of claim 5, wherein the second metal oxide layer includes $TiO_x$ (x<2) or $Ta_2O_y$ (y<2.5).

* * * * *